(12) United States Patent
Jang et al.

(10) Patent No.: US 9,343,437 B2
(45) Date of Patent: May 17, 2016

(54) SEMICONDUCTOR PACKAGE DEVICES

(71) Applicants: Ae-nee Jang, Seoul (KR); Jin-Woo Park, Seoul (KR); Seokhyun Lee, Hwaseong-si (KR); Jongho Lee, Hwaseong-si (KR)

(72) Inventors: Ae-nee Jang, Seoul (KR); Jin-Woo Park, Seoul (KR); Seokhyun Lee, Hwaseong-si (KR); Jongho Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/680,094

(22) Filed: Apr. 7, 2015

(65) Prior Publication Data

US 2015/0318266 A1 Nov. 5, 2015

(30) Foreign Application Priority Data

Apr. 30, 2014 (KR) .................. 10-2014-0052580

(51) Int. Cl.
| | | |
|---|---|---|
| *H01L 23/10* | (2006.01) | |
| *H01L 25/065* | (2006.01) | |
| *H01L 23/373* | (2006.01) | |
| *H01L 23/367* | (2006.01) | |
| *H01L 23/528* | (2006.01) | |
| *H01L 23/31* | (2006.01) | |

(52) U.S. Cl.
CPC ........ *H01L 25/0657* (2013.01); *H01L 23/3107* (2013.01); *H01L 23/3675* (2013.01); *H01L 23/3735* (2013.01); *H01L 23/3736* (2013.01); *H01L 23/528* (2013.01); *H01L 2225/0651* (2013.01); *H01L 2225/06517* (2013.01); *H01L 2225/06575* (2013.01); *H01L 2225/06589* (2013.01)

(58) Field of Classification Search
CPC ..... H01L 23/42; H01L 23/3107; H01L 24/81; H01L 23/528; H01L 23/373; H01L 24/816
USPC .................. 257/686, 707, 713, 780, E23.085
See application file for complete search history.

(56) References Cited

U.S. PATENT DOCUMENTS

| | | | | |
|---|---|---|---|---|
| 6,849,940 B1 * | 2/2005 | Chan | ...................... | H01L 23/16 257/675 |
| 6,919,631 B1 * | 7/2005 | Hoffman | ............. | H01L 23/3128 257/686 |
| 7,002,805 B2 * | 2/2006 | Lee | ...................... | H01L 25/105 257/706 |

(Continued)

OTHER PUBLICATIONS

Dreiza et al., Package on Package (PoP) Stacking and Board Level Reliability, Results of Joint Industry Study, 2006, pp. 1-8.

(Continued)

*Primary Examiner* — Nitin Parekh
(74) *Attorney, Agent, or Firm* — Myers Bigel & Sibley, P.A.

(57) ABSTRACT

Semiconductor package devices and methods of forming the semiconductor package devices are provided. The semiconductor package devices may include a lower package including a lower semiconductor chip on a lower substrate, an upper package including an upper semiconductor chip on an upper substrate. The upper substrate may include a protruding part corresponding to the lower semiconductor chip and a connection part that has a bottom surface lower than a bottom surface of the protruding part and is disposed around the protruding part. The semiconductor package devices may also include a heat dissipation part in a space between the lower semiconductor chip and the protruding part on the upper substrate and a package connection pattern electrically connecting the lower package to the upper package.

19 Claims, 10 Drawing Sheets

(56) References Cited

U.S. PATENT DOCUMENTS

| | | |
|---|---|---|
| 7,015,577 B2 | 3/2006 | Wang |
| 7,053,477 B2 | 5/2006 | Karnezos et al. |
| 7,199,466 B2 * | 4/2007 | Chiu .................. H01L 23/3677 257/707 |
| 7,420,814 B2 | 9/2008 | Kim et al. |
| 7,682,873 B2 | 3/2010 | Karnezos |
| 7,745,262 B2 | 6/2010 | Huang et al. |
| 7,989,942 B2 | 8/2011 | Toong et al. |
| 8,013,440 B2 | 9/2011 | Warren |
| 8,021,925 B2 | 9/2011 | Edwards et al. |
| 8,048,358 B2 | 11/2011 | Takano et al. |
| 8,138,024 B2 | 3/2012 | Do et al. |
| 8,143,100 B2 | 3/2012 | Karnezos |
| 8,247,900 B2 | 8/2012 | Yuan |
| 8,304,922 B2 | 11/2012 | Lee et al. |
| 8,362,607 B2 | 1/2013 | Scheid et al. |
| 8,421,217 B2 | 4/2013 | Casey et al. |
| 8,779,601 B2 | 7/2014 | Gan et al. |
| 8,786,076 B2 * | 7/2014 | Kim ...................... H01L 23/367 257/706 |
| 8,823,180 B2 | 9/2014 | Wang et al. |
| 8,836,114 B2 | 9/2014 | Oh et al. |
| 2005/0095875 A1 * | 5/2005 | Huang .................. H01L 21/561 438/800 |
| 2005/0280141 A1 * | 12/2005 | Zhang ................. H01L 23/3128 257/707 |
| 2013/0087911 A1 | 4/2013 | Gregorich et al. |
| 2013/0093073 A1 | 4/2013 | Chen et al. |
| 2013/0105979 A1 | 5/2013 | Yu et al. |
| 2013/0105991 A1 | 5/2013 | Gan et al. |
| 2013/0147065 A1 | 6/2013 | Lee et al. |

OTHER PUBLICATIONS

Smith, "Package-on-package: thinner, faster, denser," ElectroIQ Solid State technology, Jul. 12, 2011, pp. 1-12.

* cited by examiner

SEMICONDUCTOR PACKAGE DEVICES

CROSS-REFERENCE TO RELATED APPLICATION

This U.S. non-provisional patent application claims priority under 35 U.S.C. §119 to Korean Patent Application No. 10-2014-0052580, filed on Apr. 30, 2014, in the Korean Intellectual Property Office, the disclosure of which is hereby incorporated by reference herein in its entirety.

BACKGROUND

The present disclosure generally relates to the field of electronics and, more particularly, to semiconductor devices.

Semiconductor devices are widely used in various electronic industries due to their characteristics such as miniaturization, multi-function, and/or low manufacturing cost. Semiconductor devices may include, for example, memory devices to store data, logic devices to process data and hybrid devices to simultaneously perform various functions.

As electronic industries are highly developed, high integrity and/or high speed of semiconductor devices are increasingly demanded. In responding to this trend, semiconductor packages including semiconductor devices to realize high integrity and/or high speed have been developed.

SUMMARY

Some embodiments of the present inventive concept may provide semiconductor package devices suitable for high integrity and high speed.

According to some embodiments of the present inventive concept, semiconductor package device may include: a lower package including a lower substrate, and a lower semiconductor chip mounted on the lower substrate; an upper package disposed on the lower package, and including an upper substrate and an upper semiconductor chip mounted on the upper substrate, wherein the upper substrate includes a protruding part corresponding to the lower semiconductor chip, and a connection part of which a bottom surface is lower than a bottom surface of the protruding part and which is disposed around the protruding part; a heat dissipation part filling a space between the lower semiconductor chip and the protruding part of the upper substrate; and a package connection pattern electrically connecting the lower package to the upper package.

In some embodiments, the heat dissipation part may be spaced apart from the package connection pattern.

In some embodiments, the upper semiconductor chip may be disposed on the protruding part of the upper substrate.

In some embodiments, the heat dissipation part may include a thermal interface material (TIM).

In some embodiments, the heat dissipation part may include: a first TIM contacting the lower package; a second TIM contacting the upper package; and a metal heat slug disposed between the first TIM and the second TIM.

In some embodiments, the semiconductor package device may further include an additional heat dissipation part disposed on the upper package.

In some embodiments, the additional heat dissipation part may include a metal heat slug.

In some embodiments, a bottom surface of the heat dissipation part may be substantially coplanar with the bottom surface of the connection part of the upper substrate.

In some embodiments, a bottom surface of the heat dissipation part may be higher than the bottom surface of the connection part of the upper substrate.

In some embodiments, the package connection pattern may be electrically connected to the connection part of the upper substrate.

In some embodiments, the lower package may further include a lower mold part protecting the lower semiconductor chip on the lower substrate.

In some embodiments, the lower substrate may include a chip mounting area in which the lower semiconductor chip is mounted and a connection area at an edge portion thereof, wherein the low mold part may cover the chip mounting area and the connection area of the lower substrate and include an opening corresponding to the package connection pattern.

In some embodiments, the lower substrate may include a chip mounting area in which the lower semiconductor chip is mounted and a connection area at an edge portion thereof, wherein the lower mold part covers the chip mounting area and exposes the connection area of the lower substrate.

According to some embodiments of the present inventive concept, semiconductor package device may include: a lower package including a lower substrate, and a lower semiconductor chip mounted on the lower substrate; an upper package disposed on the lower package, and including an upper substrate and an upper semiconductor chip mounted on the upper substrate, wherein the upper substrate includes a protruding part corresponding to the lower semiconductor chip and a connection part of which a bottom surface is lower than a bottom surface of the protruding part and which is disposed around the protruding part; a heat dissipation disposed between the lower semiconductor chip and the protruding part of the upper substrate, and including a TIM and a metal heat slug; and a package connection pattern electrically connecting the lower package and the upper package.

In some embodiments, the TIM of the heat dissipation part may include: a first TIM disposed between the lower semiconductor chip and the metal heat slug; and a second TIM disposed between the metal heat slug and the protruding part of the upper substrate.

In some embodiments, the upper package may further include an upper mold part protecting the upper semiconductor chip on the upper substrate.

In some embodiments, the semiconductor package device may further include an additional heat dissipation part disposed on the upper mold part.

According to some embodiments of the present inventive concept, semiconductor package device may include: a lower package including a lower substrate, a lower semiconductor chip mounted on the lower substrate and a lower mold part covering sidewall surfaces of the lower semiconductor chip; an upper package disposed on the lower package, and including an upper substrate and an upper semiconductor chip mounted on the upper substrate, wherein the upper substrate includes a protruding part which protrudes upward, a connection part which is positioned at a lower level than a level of the protruding part and a slope part connecting the protruding part with the connection part; a heat dissipation part disposed in a space between the lower semiconductor chip and the protruding part of the upper substrate, and including at least TIM; and a package connection pattern electrically connecting the lower package and the upper package.

In some embodiments, a bottom surface of the heat dissipation part may be substantially coplanar with the bottom surface of the connection part of the upper substrate.

In some embodiments, a bottom surface of the heat dissipation part may be higher than the bottom surface of the connection part of the upper substrate.

BRIEF DESCRIPTION OF THE DRAWINGS

The accompanying drawings are included to provide explanation of the present inventive concept and are incorporated in and constitute a part of this specification. The drawings illustrate some embodiments of the present inventive concept with the detailed description to explain the present inventive concept.

DETAILED DESCRIPTION

Figure 1:
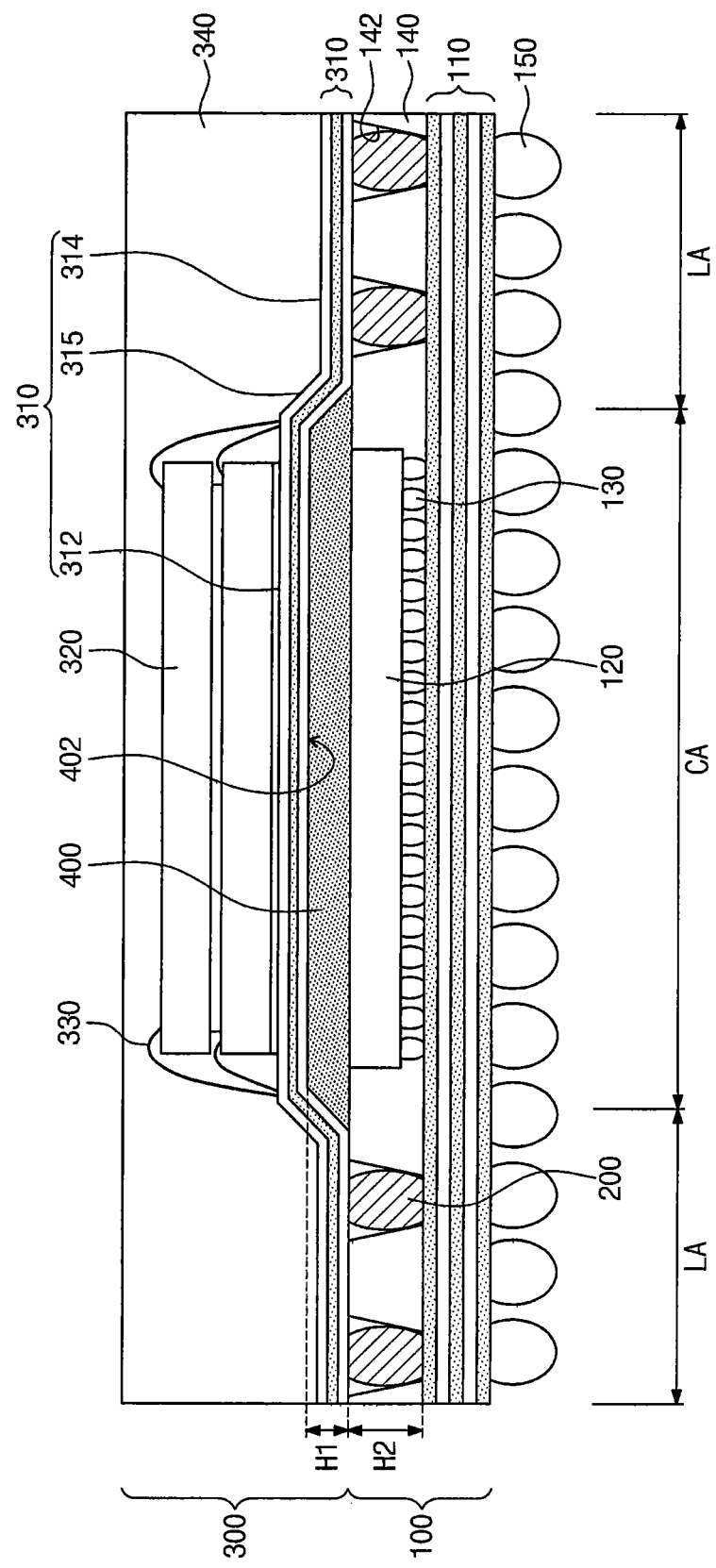
FIGS. 1 through 5 are cross-sectional views illustrating a semiconductor package device according to some embodiments of the present inventive concept.

Objects, other objects, advantages and features of the present inventive concept will be described with reference to the accompanying drawings. The present inventive concept may, however, be embodied in many different forms and should not be construed as being limited to example embodiments set forth herein. Rather, these embodiments are provided so that this disclosure will be thorough and complete and will fully convey the scope of the present inventive concept to those skilled in the art. Like reference numbers refer to like elements throughout.

In the specification, it will be understood that when a component is referred to as being "on" another component, it can be directly on the other component, or an intervening component may also be present. Also, in the figures, the dimensions of components are exaggerated for clarity of illustration.

Embodiments will be described with cross-sectional views that may be ideal views of these embodiments. Also, in the figures, dimensions of layers and regions may be exaggerated for clarity of illustration. Accordingly, shapes of the views may be modified according to manufacturing techniques and/or allowable errors. Therefore, embodiments of the present inventive concept are not limited to the specific shape illustrated in the views, but may include other shapes that may be created according to manufacturing processes. For example, an etched region having a right angle illustrated in the drawings may have a round shape or a shape having a predetermined curvature. Areas illustrated in the drawings have general properties, and are used to illustrate a specific shape of a semiconductor package region. Thus, this should not be construed as limited to the scope of the present inventive concept. It will be understood that although the terms first and second are used herein to describe various elements, these elements should not be limited by these terms. These terms are only used to distinguish one element from another element. An embodiment described and illustrated herein may include a complementary embodiment thereof.

In the following description, the technical terms are used only for explaining specific example embodiments while not limiting the present inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, some embodiments will be described in detail with reference to the accompanying drawings.

FIG. 1 is a cross-sectional view illustrating a semiconductor package device according to some embodiments of the present inventive concept.

Referring to FIG. 1, a semiconductor package device may include a lower package 100, an upper package 300, a heat dissipation part 400, and a package connection pattern 200.

The lower package 100 may include a lower substrate 110, a lower semiconductor chip 120 and a lower mold part 140. The lower substrate 110 may be, for example, a printed circuit board (PCB). For example, the lower substrate 110 may have a shape of a flat panel. The lower substrate 110 may include a chip mounting area CA at a center portion thereof and a connection area LA at an edge portion thereof. The lower semiconductor chip 120 may be mounted on the chip mounting area CA of the lower substrate 110. The lower semiconductor chip 120 may include, for example, a logic chip having a function of a processor.

The lower semiconductor chip 120 may be electrically connected to the lower substrate 110 through a lower chip connection part 130. For example, the lower chip connection part 130 may include a solder ball.

According to some embodiments of the present inventive concept, the lower mold part 140 may be formed on the lower substrate 110 to protect the lower semiconductor chip 120. For instance, the lower mold part 140 may have a top surface which may completely cover the lower substrate 110 and may be substantially coplanar with a top surface of the lower semiconductor chip 120. In other word, the lower mold part 140 may expose the top surface of the lower semiconductor chip 120 and may cover a side surface of the lower semiconductor chip 120. In some embodiments, the lower mold part 140 may cover the chip mounting area CA and the connection area LA of the lower substrate 110 entirely. The lower mold part 140 may include openings 142 partially exposing portions of the connection area LA of the lower substrate 110.

The semiconductor package device may include external terminals 150 electrically connected to a bottom surface of the lower package 100. In other word, the external terminals 150 may be disposed on the bottom surface of the lower substrate 110 to be connected to the lower package 100. Each of the external terminals 150 may include, for example, a solder ball.

The upper package 300 may include an upper substrate 310, an upper semiconductor chip 320, and an upper mold part 340. For example, the upper substrate 310 may be a printed circuit board (PCB). The upper substrate 310 may include a chip mounting area CA at a center portion thereof and a connection area LA at an edge portion thereof. In some embodiments, the upper package 300 may include two or more upper semiconductor chip 320 as illustrated in FIG. 1.

According to some embodiments of the present inventive concept, the chip mounting area CA of the upper substrate 310 may include a protruding part 312 which protrudes upward, and the connection area LA of the upper substrate 310 may include a connection part 314 which is positioned at a lower level than a level of the protruding part 312. The height difference of H1 may be a distance between a bottom surface of the protruding part 312 and a bottom surface of the connection part 314. In addition, the upper substrate 310 may include a slope part 315 connecting the protruding part 312 with the connection part 314. The slope part 315 may be disposed between the protruding part 312 and the connection part 314. The protruding part 312 of the upper substrate 310 may be spaced apart from a top surface of the lower semiconductor chip 120 of the lower package 100. The connection part 314 of the upper substrate 310 may be in contact with a lower mold part 140 of the lower package 100. The upper semiconductor chip 320 may be mounted on the chip mounting area CA of the upper substrate 310. The upper semiconductor chip 320 may be electrically connected to the upper substrate 310 through an upper chip connection part 330. The upper chip connection part 330 may include, for example, a bonding wire.

According to some embodiments, a plurality of the upper semiconductor chips 320 may be mounted on the chip mounting area CA of the upper substrate 310. Although stacked upper semiconductor chips 320 including two chips are illustrated in FIG. 1, the number and mounting type of the semiconductor chips 320 are not limited thereto. In addition to a plurality of stacked semiconductor chips, the upper semiconductor chip 320 may further include one or more semiconductor chips horizontally spaced apart from the plurality of stacked semiconductor chips. The upper semiconductor chip 320 may include, for example, a memory chip.

The heat dissipation part 400 may be disposed between the upper package 300 and the lower package 100. According to some embodiments of the present inventive concept, the heat dissipation part 400 may fill a space 402 between the lower semiconductor chip 120 of the lower package 100 and the protruding part 312 of the upper substrate 310 of the upper package 300. In some embodiment, the heat dissipation part 400 may partially fill the space 402 between the lower semiconductor chip 120 of the lower package 100 and the protruding part 312 of the upper substrate 310 of the upper package 300. A bottom surface of the connection part 314 of the upper substrate 310 may be substantially coplanar with a bottom surface of the heat dissipation part 400. The heat dissipation part 400 may include a thermal interface material (TIM). The TIM may have heat dissipating property as well as property of adhering the upper package 300 and the lower package 100. The heat dissipation part 400 may have a thickness of H1. In some embodiments, the thickness of the heat dissipation part 400 may be same as the distance H1 between the lower semiconductor chip 120 and the protruding part 312 of the upper substrate 310. In some embodiments, the thickness of the heat dissipation part 400 may be smaller than the distance H1 between the lower semiconductor chip 120 and the protruding part 312 of the upper substrate 310.

The TIM that may be a flowable material may be disposed between the upper package 300 and the lower package 100 and then may be hardened through a hardening process. The TIM may be disposed in the space 402 provided between the lower semiconductor chip 120 and the protruding part 312 of the upper substrate 310. Accordingly, the TIM may stay in the space 402 and may not be flow to the outside. As a result, the heat dissipation part 400 may be spaced apart from the package connection pattern 200, thereby reducing or possibly preventing a defect caused by contact between the heat dissipation part 400 and the package connection pattern 200.

The package connection pattern 200 may be disposed in each of the openings 142 of the lower mold part 140 to electrically connect the lower package 100 to the upper package 300. The package connection pattern 200 may include, for example, a solder ball. The package connection pattern 200 may have a height of H2.

The package connection pattern 200 may connect the connection area LA of the lower substrate 110 to the connection area LA of the upper substrate 310 by passing through the lower mold part 140. The space 402 between the protruding part 312 of the upper substrate 310 and the lower package 100 may be created due to a structure of the upper substrate 310 and may be filled with the heat dissipation part 400 to improve heat dissipation effect.

Figure 2:
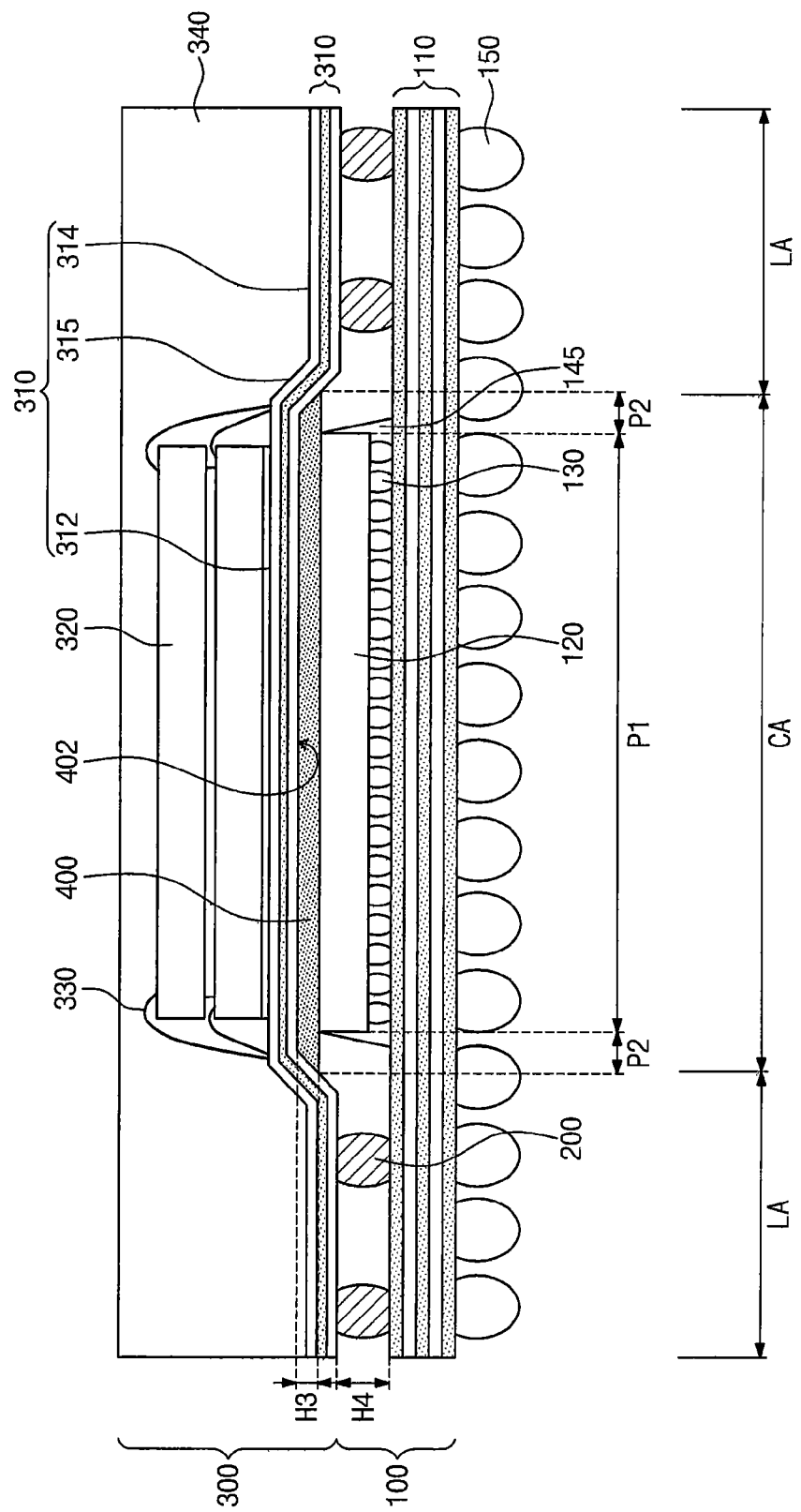

FIG. 2 is a cross-sectional view illustrating a semiconductor package device according to some embodiments of the present inventive concept.

Referring to FIG. 2, a semiconductor package device may include a lower package 100, an upper package 300, a heat dissipation part 400, and a package connection pattern 200. The lower package 100, the upper package 300, the heat dissipation part 400 which are respectively similar to the lower package 100, the upper package 300, the heat dissipation part 400, and the package connection pattern 200 of the semiconductor package as described in the FIG. 1. The semiconductor package device of FIG. 2 may include a lower mold part having a structure different from that of FIG. 1.

The lower mold part 145 disposed on a lower substrate 110 of the lower substrate 110 may have a mold underfill (MUF) structure. Specifically, the lower mold part 145 may expose a top surface of a lower semiconductor chip 120 and may cover side and bottom surfaces of the lower semiconductor chip 120. The lower mold part 145 may cover a portion of the lower substrate 110, which is different with the lower mold part 140 described in FIG. 1. The lower mold part 145 may extend in a chip mounting area CA but may not extend in a connection area LA of the lower substrate 110. In some embodiments, the lower mold part 145 may cover a chip mounting area CA but not cover a connection area LA of the lower substrate 110. Therefore, it is unnecessary to provide openings (e.g., 142 in FIG. 1) for the package connection pattern 200 in the lower mold part (e.g., 140 in FIG. 1).

The upper package 300 mounted on the lower package 100 may be disposed more closely to the lower package 100 due to a structure of the lower mold part 145 of the lower package 100. Specifically, the upper substrate 310 of the upper package 300 may include a protruding part 312 and a connection part 314, and the protruding part 312 may be disposed at a position corresponding to the lower semiconductor chip 120. In some embodiments, the protruding part 312 may overlie the lower semiconductor chip 120. Since the lower mold part 145 has a structure which covers the chip mounting area CA and exposes the connection area LA of the lower substrate 110, the protruding part 312 of the upper substrate 310 may be disposed more closely to the lower semiconductor chip 120. In addition, a bottom surface of the connection part 314 of the upper substrate 314 may be at a lower level than a level of a top surface of the lower semiconductor chip 120.

A distance H3 between the lower semiconductor chip 120 and the protruding part 312 of the upper substrate 310 may be smaller than the distance H1 between the lower semiconductor chip 120 and the protruding part 312 of the upper substrate 310 illustrated in FIG. 1. Therefore, a thickness of a heat dissipation part 400 disposed between the lower semiconductor chip 120 and the protruding part 312 of the upper substrate 310 may be smaller than a thickness of the heat dissipation part 400 illustrated in FIG. 1. The heat dissipation part 400 may include a first portion P1, which is in contact with the top surface of the lower semiconductor chip 120, and a second portion P2, which is an outer peripheral portion of the first portion P1. According to some embodiments, the first portion P1 and the second portion P2 of the heat dissipation part 400 may have different thicknesses.

In addition, a distance between the lower package 100 and the upper package 300 may be reduced to a distance between the lower semiconductor chip 120 and the protruding part 312 of the upper substrate 310. Therefore, a size (or height) of the package connection pattern 200 may be smaller than a size (or height) of the package connection pattern 200 illustrated in FIG. 1. In other words, the height H4 of the package connection pattern 200 may be smaller than the height H2 of the connection pattern 200 shown in the FIG. 1. As a result, a total size (or height) of the semiconductor package device may be smaller than a total size (or height) of the semiconductor package device of FIG. 1.

Figure 3:
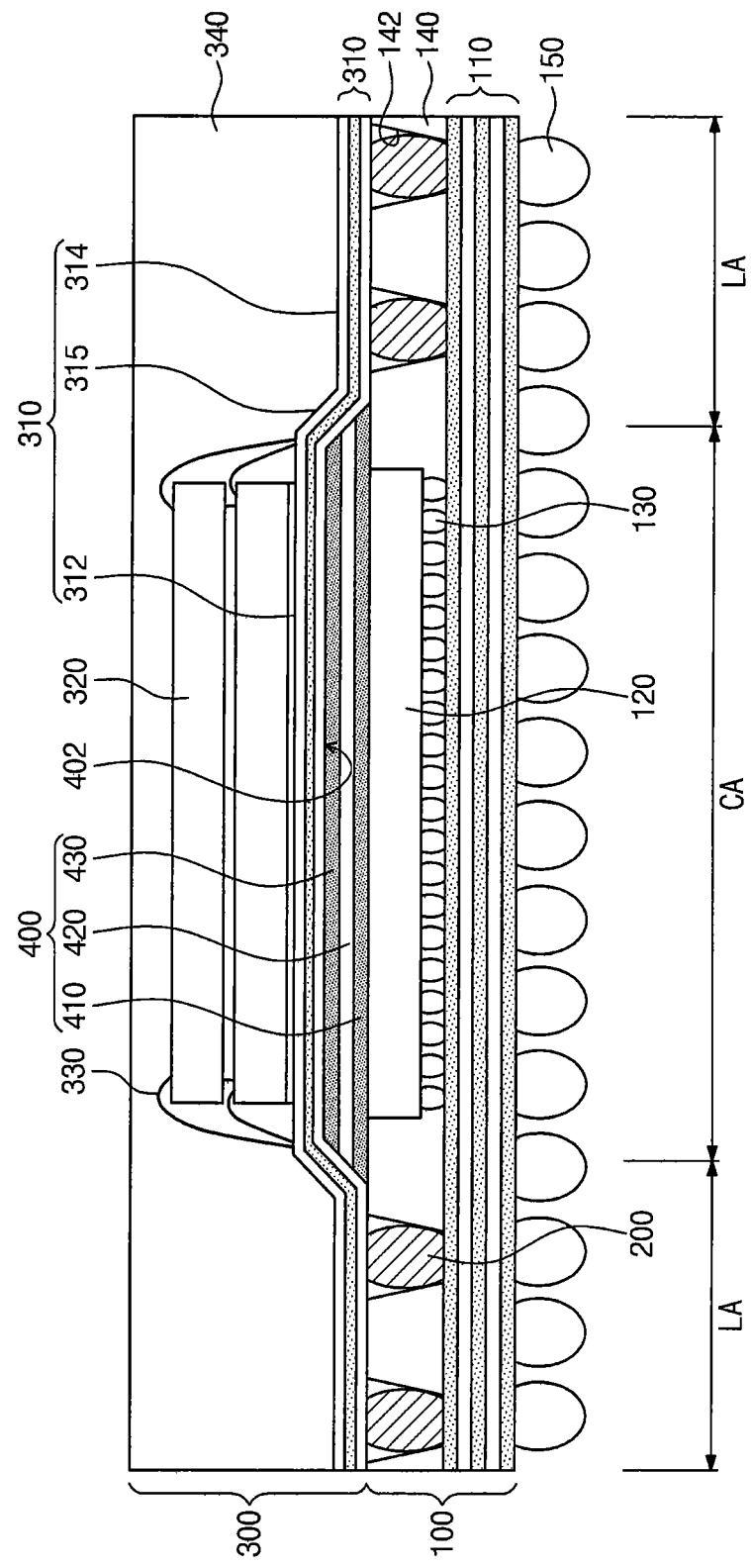
Figure 4:
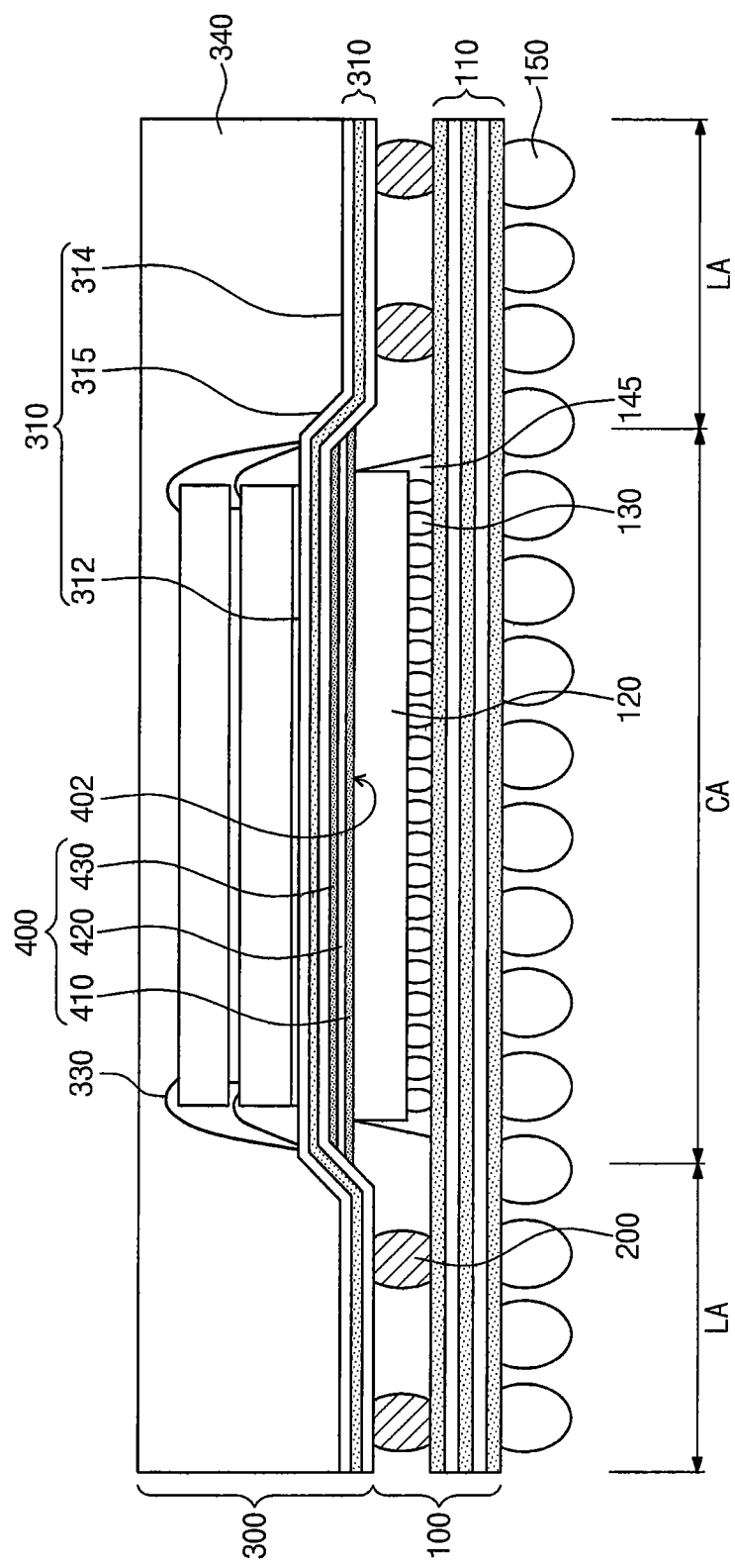

FIGS. 3 and 4 are cross-sectional views illustrating a semiconductor package device according to some embodiments of the present inventive concept.

Referring to FIGS. 3 and 4, a semiconductor package device may include a lower package 100, an upper package 300, a heat dissipation part 400, and a package connection pattern 200. The lower package 100, the upper package 300, and the package connection pattern 200 are substantially same as those described in FIGS. 1 and 2. The semiconductor package devices of FIGS. 3 and 4 may include a heat dissipation part 400 having a structure different from that of FIG. 1 or 2. The heat dissipation part 400 may be disposed between a lower semiconductor chip 120 of the lower package 100 and a protruding part 312 of an upper substrate 310 of the upper package 300. The heat dissipation part 400 may include a first TIM 410 that is in contact with the lower semiconductor chip 120, a second TIM 430 that is in contact with the upper substrate 310 and a metal heat slug 420 disposed between the first and the second TIMs 410 and 430. The TIMs 410 and 430 may allow the upper package 300 to adhere to the lower package 100 due to its heat dissipation and adhesion properties. In addition, the metal heat slug 420 may be adhered by the first and the second TIMs 410 and 430. The metal heat slug 420 may be better in heat dissipation property than the first and the second TIMs 410 and 430, thereby improving heat dissipation effect.

Referring to FIG. 3 according to some embodiments, a lower mold part 140 of the lower package 300 may have substantially the same structure as described in FIG. 1. Referring to FIG. 4 according to some embodiments, a lower mold part 145 of the lower package 300 may have substantially the same structure as described in FIG. 2.

Figure 5:
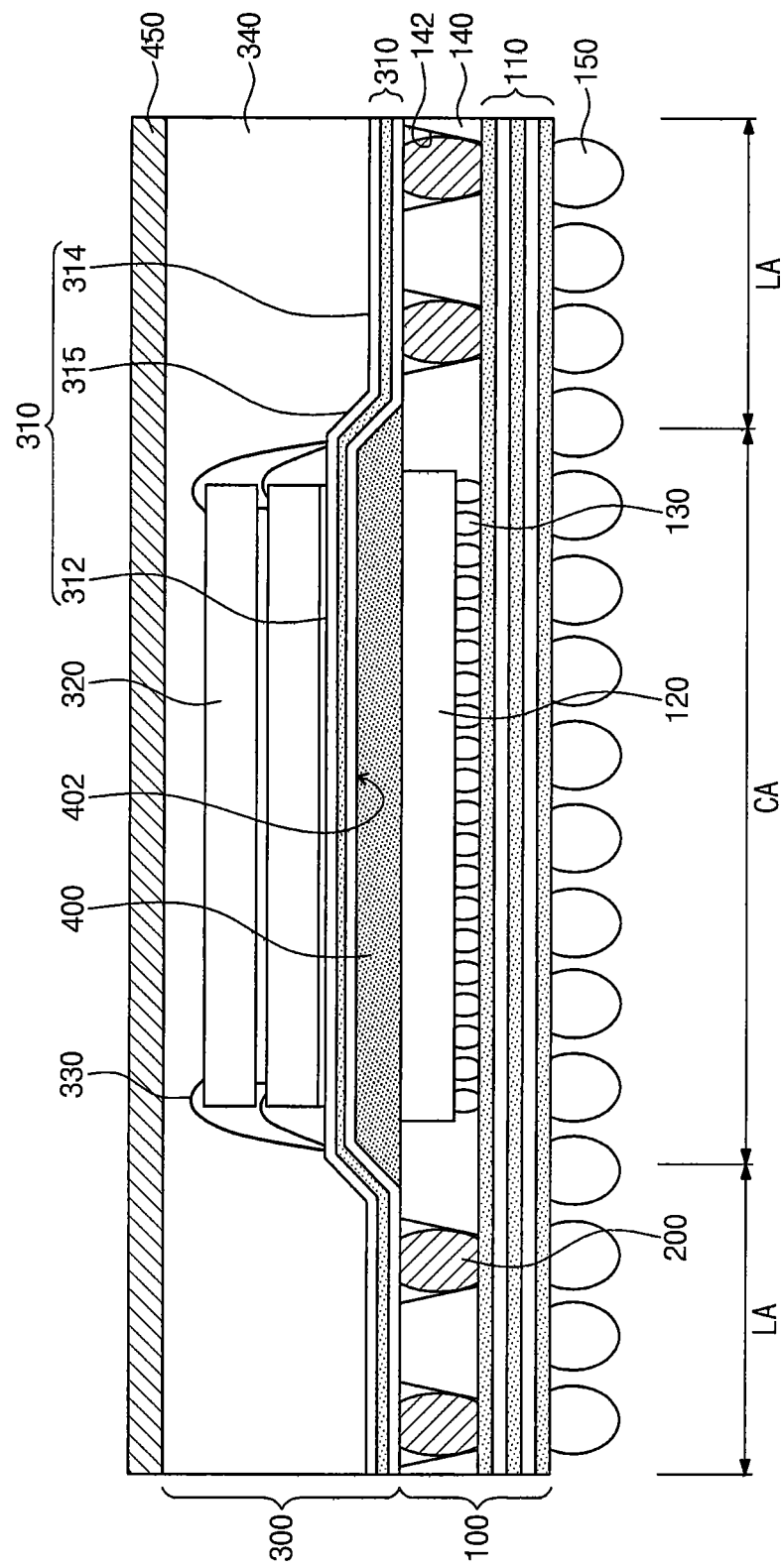

FIG. 5 is a cross-sectional view illustrating a semiconductor package device according to some embodiments of the present inventive concept.

Referring to FIG. 5, a semiconductor package device may include a lower package 100, an upper package 300, a heat dissipation part 400, and a package connection pattern 200. The lower package 100, the upper package 300, and the package connection pattern 200 are substantially same as those described in FIG. 1. The semiconductor package device of FIG. 5 may further include an additional heat dissipation part 450.

In some embodiments, the heat dissipation part 400 may include the heat dissipation part 400 illustrated in FIG. 1 as illustrated in FIG. 5. However, the present inventive concept is not limited thereto, and thus the heat dissipation part 400 illustrated in FIG. 3 may be included in the semiconductor package device of FIG. 5.

In some embodiments, the lower mold part 140 may include the lower mold part 140 illustrated in FIG. 1. However, the present inventive concept is not limited thereto, and thus the heat dissipation part 145 illustrated in FIG. 2 may be included in the semiconductor package device of FIG. 5.

Referring to FIG. 5, the semiconductor package device may further include a supplementary heat dissipation part 450. The supplementary heat dissipation part 450 may be disposed on an upper mold part 340 of the upper package 300. The supplementary heat dissipation part 450 may include a metal heat slug. The upper mold part 340 may have an adhesion property, and thus an additional TIM may not be included in the semiconductor package device of FIG. 5. Heat dissipation effect of the semiconductor package device may be improved by further including the supplementary heat dissipation part 450.

FIGS. 6 through 9 are cross-sectional views illustrating a method for manufacturing a semiconductor package device according to some embodiments of the present inventive concept.

Figure 6:
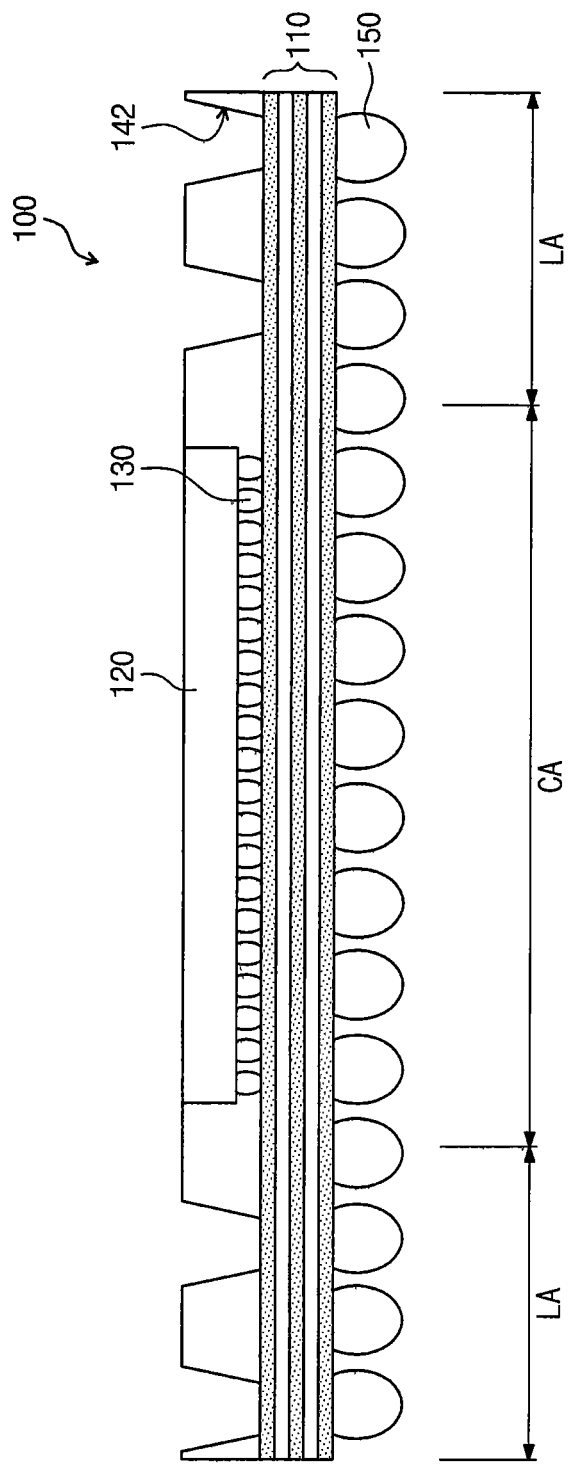
FIGS. 6 through 9 are cross-sectional views illustrating a method for manufacturing a semiconductor package device according to some embodiments of the present inventive concept.

Referring to FIG. 6, a lower package 100 may be provided.

More specifically, a lower semiconductor chip 120 may be mounted on a lower substrate 110 including a chip mounting area CA and a connection area LA using lower chip connection patterns 130. The lower semiconductor chip 120 may be mounted on the chip mounting area CA of the lower substrate 110.

A lower mold part 140 may be formed on a top surface of the lower substrate 110.

According to some embodiments, the lower mold part 140 may cover bottom and side surfaces of the lower semiconductor chip 120 and thus cover the chip mounting area CA and the connection area LA of the lower substrate 110 on the whole, as illustrated in FIG. 1. Openings 142 exposing portions of the connection area LA of the lower substrate 110 may be formed by, for example, drilling the lower mold part 140.

According to some embodiments, the lower mold part 140 may have a mold underfill (MUF) structure covering only bottom and side surfaces of the lower semiconductor chip 120 as illustrated in FIG. 2. For example, the lower mold part 145 illustrated in FIG. 2 may cover a chip mounting area CA and may expose a connection area LA. In this case, the drilling process may not be performed.

External terminals 150 may be formed on a bottom surface of the lower substrate 110. Each of the external terminals 150 may include a solder ball.

Figure 7:
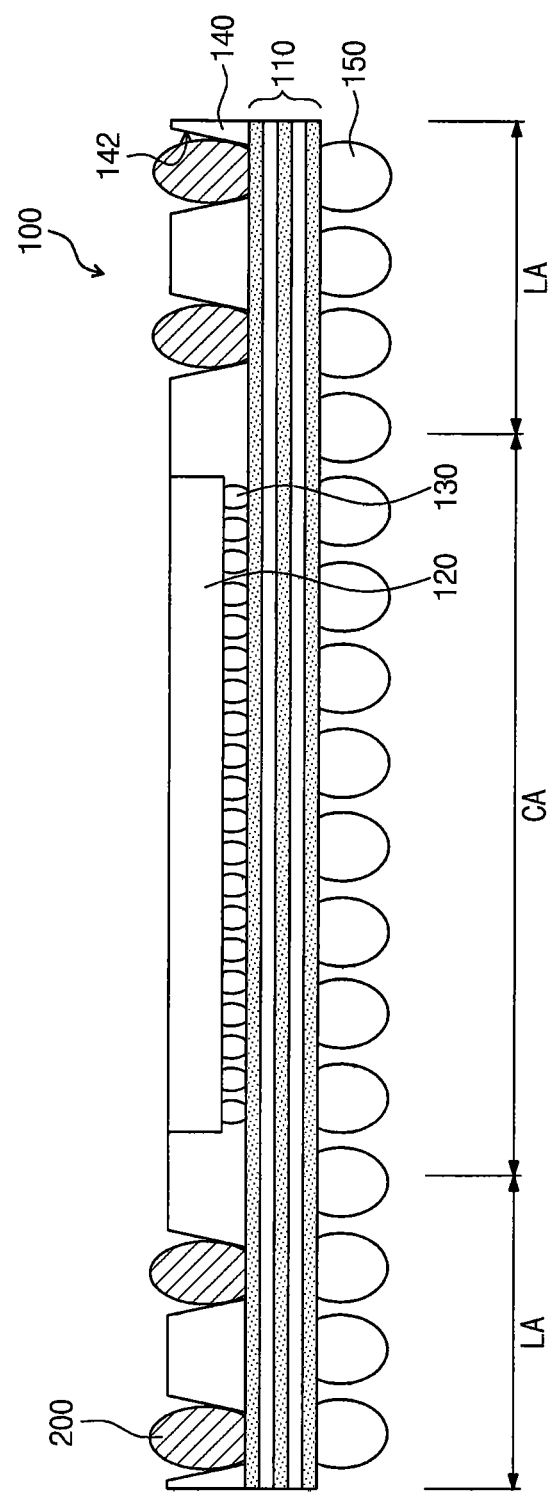

Referring to FIG. 7, a package connection pattern 200 may be formed in each of the openings 142. For instance, the package connection pattern 200 may include a solder ball. According to some embodiments, the package connection pattern 200 may be formed on a top surface of the lower substrate 110 as illustrated in FIG. 2.

Figure 8:
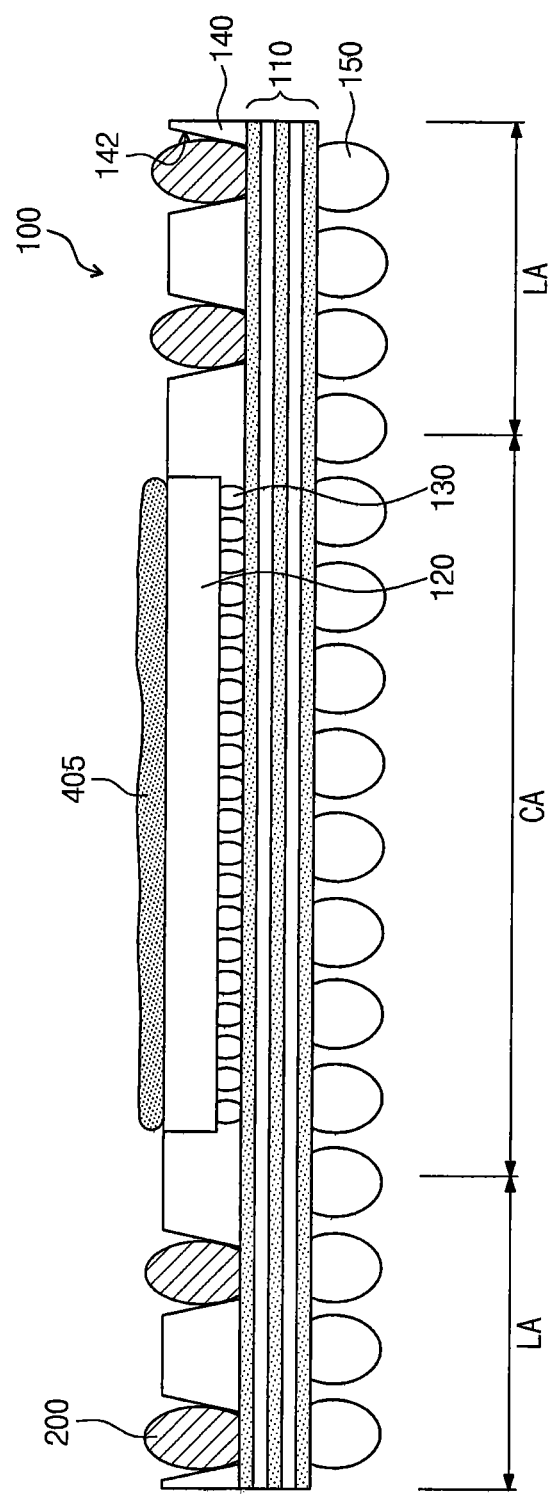

Referring to FIG. 8, a heat dissipation material 405 may be applied on the lower semiconductor chip 120 and may have a constant thickness (e.g., uniform thickness). According to some embodiments of the present inventive concept, the heat dissipation material 405 may include a thermal interface material (TIM). The TIM may be a flowable material and may have adhesion properties.

Figure 9:
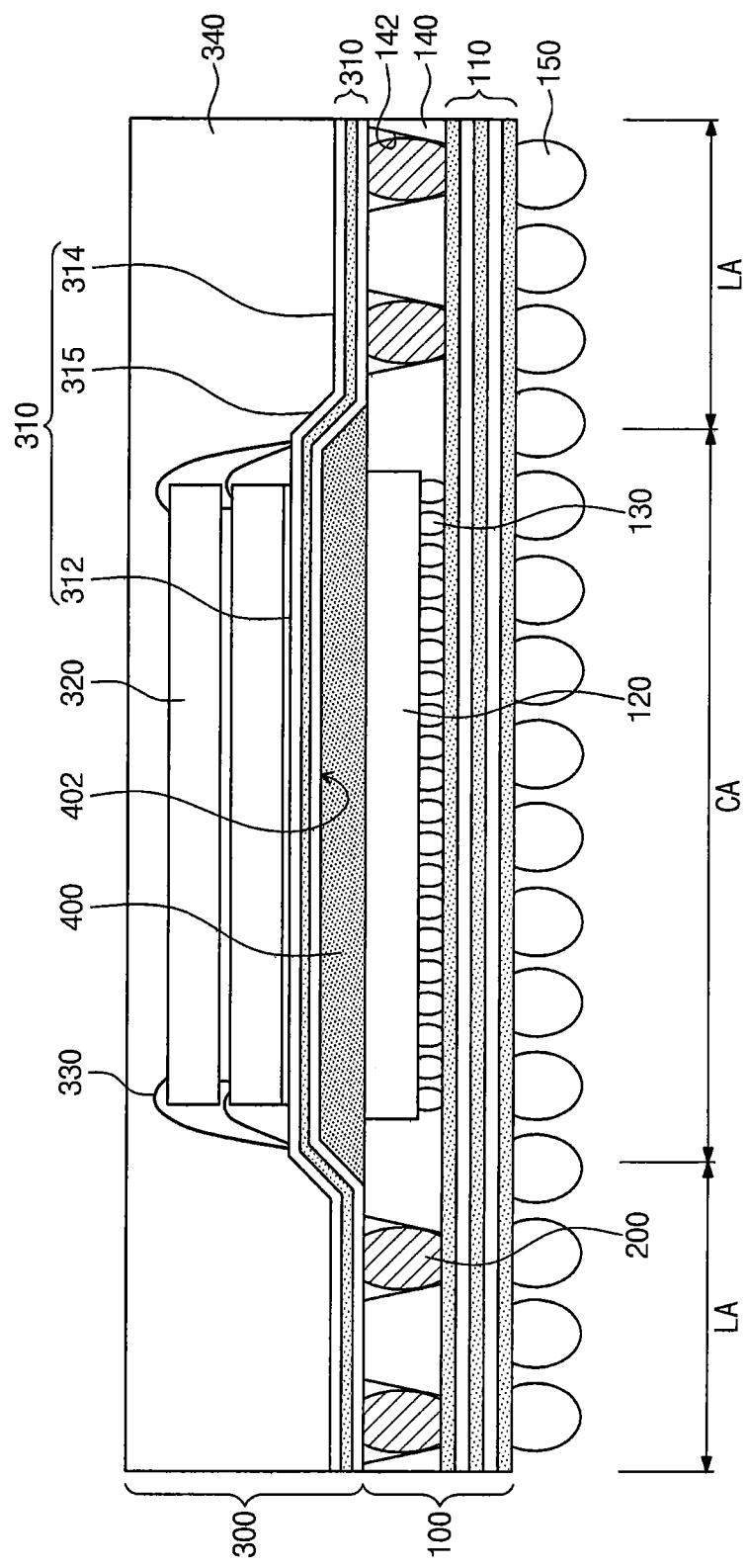

Referring to FIG. 9, an upper package 300 may be formed. More specifically, mold technology may be used to form the upper substrate 310 having a protruding part 312 at a center portion thereof, a connection part 314 at an edge portion thereof, and a slope part 315 provided therebetween. A height difference of H1 may exist between a bottom surface of the protruding part 312 and a bottom surface of the connection part 314 as illustrated in FIG. 1, and thus there may be a stepped portion. The protruding part 312 may include a chip mounting area CA and the connection part 314 may include a connection area LA. Accordingly, the upper semiconductor chip 320 may be mounted on the chip mounting area CA of the upper substrate 310. The upper semiconductor chip 320 may be connected to the upper substrate 310 by the upper chip connection part 330. The upper chip connection part 330 may include, for example, a wire bonding. As illustrated, the upper semiconductor chip 320 may have a multi-stacked structure.

The overlying upper semiconductor chip 320 may be adhered to the underlying upper semiconductor chip 320 through adhesion parts.

An upper mold part 340 protecting the upper semiconductor chip 320 may be formed on the upper substrate 310. The upper package 300 may be mounted on the lower package 100 by electrically connecting the upper substrate 310 to the package connection pattern 200.

A space 402 between the lower package 100 and the upper package 300 may be defined by a height difference between the protruding part 312 and the connection part 314 of the upper substrate 310. The space 402 may be filled with a heat dissipation material (e.g., 405 in FIG. 8) applied on the lower semiconductor chip 120.

According to some embodiments, the space 402 defined between the protruding part 312 and the connection part 314 may be filled by applying a heat dissipation material on a bottom surface of the protruding part 312 of the upper substrate 310 to a constant thickness (e.g., a uniform thickness). The heat dissipation material may include a TIM. The heat dissipation material may be applied on the top surface of the lower semiconductor chip 120 and the bottom surface of the protruding part 312 of the upper substrate 310.

A heat dissipation part 400 that may fill the space 402 between the lower semiconductor chip 120 and the protruding part 312 of the upper substrate 310 may be formed by hardening the heat dissipation material 405. In some embodiments, the heat dissipation part 400 may partially fill the space 402 between the lower semiconductor chip 120 and the protruding part 312 of the upper substrate 310.

According to some embodiments of the present inventive concept, the heat dissipation part may have a structure similar to that illustrated in FIGS. 3 and 4, the metal heat slug 420 may be formed after applying the TIM as a heat dissipation material in the stepped space 402 below the protruding part 312 of the upper substrate 310. As described above, the metal heat slug 420 may be adhered in the space by means of the adhesion property of TIM. When the upper package 300 is mounted on the lower package 100, the metal heat slug 420 may be brought into contact with the TIM as the heat dissipation material (e.g., 145 of FIG. 8) on the lower semiconductor chip 120. The heat dissipation part 400 including a first TIM 410, the metal heat slug 420, and a second TIM 430 may be formed by hardening the TIMs.

According to some embodiments of the present inventive concept, a supplementary heat dissipation part 450 may be further formed on the upper mold part 340 as illustrated in FIG. 5.

Simulation

Hereinafter, simulation results regarding internal temperature and temperature per watt in a semiconductor package device illustrated in FIG. 10, the semiconductor package device illustrated in FIG. 1 and the semiconductor package device illustrated in FIG. 3.

Figure 10:
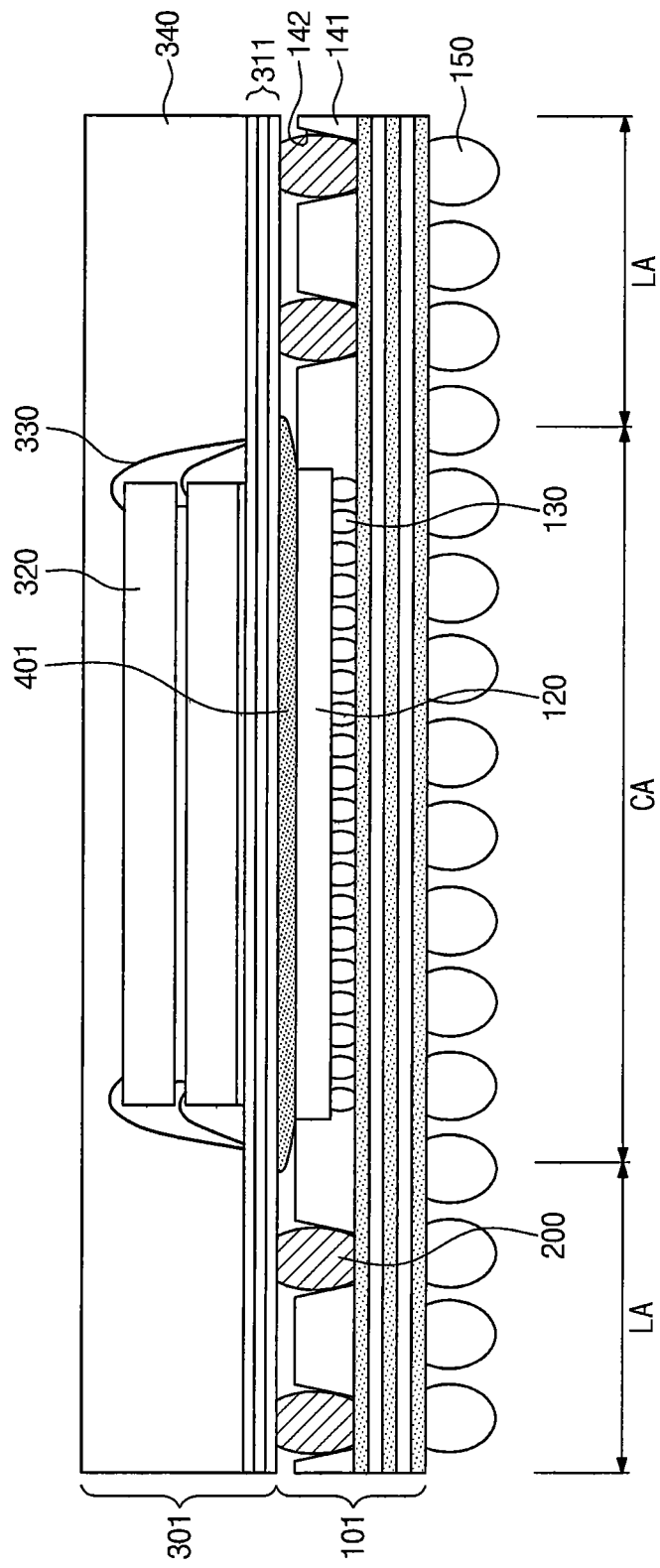
FIG. 10 is a cross-sectional view illustrating a semiconductor package device.

FIG. 10 is a cross-sectional view illustrating the semiconductor package device. Referring to FIG. 10, the semiconductor package device may include a lower package 101, an upper package 301, a heat dissipation part 401 and a lower mold part 141. As illustrated, an upper substrate 311 of the upper package 301 may have a structure of a flat panel which may not include a space for the heat dissipation part 401 that is disposed between the lower package 101 and the upper package 301. A heat dissipation part 401 of the semiconductor package device of FIG. 10 may be disposed between the lower package 101 and the upper package 301 and may include a thermal interface material (TIM).

The heat dissipation part 400 of the semiconductor package device in FIG. 1 may include a TIM disposed in the space 402 defined by the protruding part 312 of the upper substrate 310. The heat dissipation part 400 of the semiconductor package device in FIG. 3 may include a structure in which a first TIM 410, a metal heat slug 420, and a second TIM 430 are stacked in the space 402 defined by the protruding part 312 of the upper substrate.

Table 1 below shows simulation results of temperature and temperature per watt of the semiconductor package device illustrated in FIG. 10, the semiconductor package device illustrated in FIG. 1, and the semiconductor package device illustrated in FIG. 3. A total power of 6.8 W, four stacked semiconductor chips, and JEDEC STD simulation are used as simulation conditions.

TABLE 1

|  | Semiconductor package device of FIG. 10 | Semiconductor package device of FIG. 1 | Semiconductor package device of FIG. 3 |
| --- | --- | --- | --- |
| Temperature(° C.) | 150.95 | 144.21 | 140.42 |
| Temperature per Watt (° C./W) | 18.50 | 17.51 | 16.95 |

As shown in Table. 1, heat dissipating effects of semiconductor package devices of FIG. 1 and FIG. 3 are superior to that of the semiconductor package device of FIG. 10 by about 5.35% and 8.36%, respectively. This enhancement may be caused by a space for a heat dissipating part, which is defined by a structure of an upper substrate to reduce or possibly prevent a defect that occurs when the heat dissipating part is formed. In addition, a heat dissipating effect of the semiconductor package device of FIG. 3 is superior to that of the semiconductor package device of FIG. 1 because the semiconductor package device of FIG. 3 additionally includes a metal heat slug as discussed above.

According to some embodiments of the present inventive concept, an upper substrate may include a protruding part and a connection part connected to the protruding part. The connection part of the upper substrate may be disposed closer to a lower substrate than the protruding part, and thus a size or height of a package connection pattern connecting an upper package to a lower package may decrease.

In addition, a space between the protruding part of the upper substrate and the lower package may be provided by a structure of the upper substrate to increase heat dissipation effect by filling the space with a heat dissipation part.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:
1. A semiconductor package device, comprising:
 a lower package comprising a lower substrate, a lower semiconductor chip on the lower substrate, and a lower mold part protecting the lower semiconductor chip on the lower substrate, wherein the lower substrate comprises a chip mounting area on which the lower semi- conductor chip is disposed and a connection area at an edge portion of the lower substrate;

an upper package on the lower package, wherein the upper package comprises an upper substrate and an upper semiconductor chip on the upper substrate, and wherein the upper substrate comprises a protruding part overlying the lower semiconductor chip and a connection part having a bottom surface that is lower than a bottom surface of the protruding part and being disposed around the protruding part;

a heat dissipation part in a space between the lower semiconductor chip and the protruding part of the upper substrate; and a package connection pattern electrically connecting the lower package and the upper package, wherein the lower mold part covers the chip mounting area and the connection area of the lower substrate and comprises an opening in which the package connection pattern is disposed.

2. The device of claim 1, wherein the heat dissipation part is spaced apart from the package connection pattern.

3. The device of claim 1, wherein the upper semiconductor chip is on the protruding part of the upper substrate.

4. The device of claim 1, wherein the heat dissipation part comprises a thermal interface material (TIM).

5. The device of claim 1, wherein the heat dissipation part comprises:
a first TIM contacting the lower package;
a second TIM contacting the upper package; and
a metal heat slug between the first TIM and the second TIM.

6. The device of claim 1, further comprising a supplementary heat dissipation part on the upper package.

7. The device of claim 6, wherein the supplementary heat dissipation part comprises a metal heat slug.

8. The device of claim 1, wherein a bottom surface of the heat dissipation part is substantially coplanar with the bottom surface of the connection part of the upper substrate.

9. The device of claim 1, wherein a bottom surface of the heat dissipation part is higher than the bottom surface of the connection part of the upper substrate.

10. The device of claim 1, wherein the package connection pattern is electrically connected to the connection part of the upper substrate.

11. A semiconductor package device, comprising:
a lower package comprising a lower substrate and a lower semiconductor chip on the lower substrate;
an upper package on the lower package, wherein the upper package comprises an upper substrate and an upper semiconductor chip on the upper substrate, and the upper substrate is between the upper semiconductor chip and the lower semiconductor chip, and wherein the upper substrate comprises a protruding part overlying the lower semiconductor chip, a connection part having a bottom surface that is lower than a bottom surface of the protruding part and being disposed around the protruding part and as slope part connecting the protruding part and the connection part;
a heat dissipation part between the lower semiconductor chip and the protruding part of the upper substrate, wherein the heat dissipation part is disposed in a space defined by the protruding part and the slope part of the upper substrate; and
a package connection pattern electrically connecting the lower package and the upper package.

12. The device of claim 11, wherein the heat dissipation part comprises:
a metal slug;
a first TIM between the lower semiconductor chip and the metal heat slug;
a second TIM between the metal heat slug and the protruding part of the upper substrate.

13. The device of claim 11, wherein the upper package further comprises an upper mold part protecting the upper semiconductor chip on the upper substrate.

14. The device of claim 13, further comprising a supplementary heat dissipation part on the upper mold part.

15. A semiconductor package device, comprising:
a lower package comprising a lower substrate, a lower semiconductor chip on the lower substrate and a lower mold part on a sidewall of the lower semiconductor chip;
an upper package on the lower package, wherein the upper package comprises an upper substrate and an upper semiconductor chip on the upper substrate, and the upper substrate is between the upper semiconductor chip and the lower semiconductor chip, wherein the upper substrate comprises a protruding part that protrudes upward, a connection part that is positioned at a lower level than a level of the protruding part and a slope part between the protruding part and the connection part, and wherein a bottom surface of the connection part of the upper substrate is higher than a bottom surface of the lower semiconductor chip;
a heat dissipation part in a space between the lower semiconductor chip and the protruding part of the upper substrate; and
a package connection pattern electrically connecting the lower package and the upper package.

16. The device of claim 15, wherein a bottom surface of the heat dissipation part is substantially coplanar with the bottom surface of the connection part of the upper substrate.

17. The device of claim 15, wherein a bottom surface of the heat dissipation part is higher than the bottom surface of the connection part of the upper substrate.

18. The device of claim 15, wherein the heat dissipation part is disposed in a space defined by the protruding part and the slope part of the upper substrate.

19. The device of claim 11, wherein the bottom surface of the connection part of the upper substrate is higher than a bottom surface of the lower semiconductor chip.

* * * * *